United States Patent
Mohsen et al.

(10) Patent No.: US 7,289,777 B2
(45) Date of Patent: Oct. 30, 2007

(54) POWER CONTROL FOR NON-CONSTANT ENVELOPE MODULATION

(75) Inventors: Sarachi Mohsen, Swindon (GB); Tim Land, Fleet (GB)

(73) Assignee: Nokia Corporation, Espoo (FI)

( * ) Notice: Subject to any disclaimer, the term of this patent is extended or adjusted under 35 U.S.C. 154(b) by 234 days.

(21) Appl. No.: 10/481,726

(22) PCT Filed: Jun. 19, 2002

(86) PCT No.: PCT/GB02/02897

§ 371 (c)(1),
(2), (4) Date: Dec. 22, 2003

(87) PCT Pub. No.: WO02/103924

PCT Pub. Date: Dec. 27, 2002

(65) Prior Publication Data
US 2004/0166885 A1    Aug. 26, 2004

(30) Foreign Application Priority Data
Jun. 20, 2001    (GB) .................... 0115082.0

(51) Int. Cl.
*H01Q 11/12*    (2006.01)
(52) U.S. Cl. ............... 455/127.1; 455/126; 455/522; 455/249.1; 455/137
(58) Field of Classification Search ............ 455/522, 455/523, 60, 63.3, 67.16, 69, 70, 71, 118, 455/119, 127.1, 127.4, 131, 137, 138, 142, 455/144, 177.1, 264, 249.1, 250.1; 370/318
See application file for complete search history.

(56) References Cited

U.S. PATENT DOCUMENTS

| 5,208,549 | A | 5/1993 | Andoh |
| 5,675,611 | A | 10/1997 | Lehtinen et al. |
| 5,697,074 | A | 12/1997 | Makikallio et al. |
| 6,853,836 | B2 | 2/2005 | Asam et al. |

FOREIGN PATENT DOCUMENTS

| EP | 0 588 424 A1 | 3/1994 |
| EP | 1 211 801 A2 | 6/2002 |
| WO | WO 00/31881 | 6/2000 |
| WO | WO 00/31894 | 6/2000 |
| WO | WO 01/03292 A1 * | 1/2001 |

(Continued)

OTHER PUBLICATIONS

Asbeck et al, "A Polar Linearisation System for RF Power Amplifiers," Electronics, Circuits and Systems, 2000, the 7th IEEE International Conference, vol. 1, Dec. 17-20, 2000, pp. 478-481.

(Continued)

*Primary Examiner*—Nay Maung
*Assistant Examiner*—Dominic E. Rego
(74) *Attorney, Agent, or Firm*—Squire, Sanders & Dempsey L.L.P.

(57) ABSTRACT

There is disclosed a method and apparatus for control of a power control loop. The method comprises the steps of: amplifying a non-constant envelope modulation signal to thereby produce an output signal; combining a power level control signal with a signal representing the envelop of modulation; comparing the combined signal to a signal representing the power level of the output signal to thereby produce a comparison signal; and attenuating the amplified signal in dependence on said comparison signal.

8 Claims, 2 Drawing Sheets

FOREIGN PATENT DOCUMENTS

| | | |
|---|---|---|
| WO | WO 01/10013 A1 | 2/2001 |
| WO | WO 01/22575 A1 | 3/2001 |
| WO | WO 01/24356 | 4/2001 |

OTHER PUBLICATIONS

Extracts from "RF Power Amplifiers for Wireless Communications," by Steve C. Cripps, published 1999, ISBN 0-89006-989-1, pp. 251-282.

Extracts from PhD thesis "Linearization of RF Power Amplifiers" by Mark Briffa, Dec. 1996, pp. 21-38.

Paper by Su et al, "An IC for Linearizing RF Power Amplifiers Using Envelope Elimination and Restoration," IEEE Journal of Solid-State Circuits, vol. 33, Issue 12, Dec. 1998, pp. 2252-2258.

Paper by Kenington et al, "GSM-EDGE High Power Amplifier Utilising Digital Linearization," IMS' 01 Digest, Phoenix, Arizonia, May 20-25, 2001, pp. 1517-1520.

* cited by examiner

POWER CONTROL FOR NON-CONSTANT ENVELOPE MODULATION

FIELD OF THE INVENTION

The present invention relates to a technique for power control in transmitters utilising non-constant envelope modulation techniques, and particularly but not exclusively to such transmitters forming part of a wireless communications system.

BACKGROUND TO THE INVENTION

Power control loops, such as provided in wireless communication systems, are typically provided to control and maintain output power at a desired level, and to control transient responses when ramping up or down.

In a TDMA signalling format, a framed structure comprises a number of time slots (or channels). A wireless communications system using TDMA, for example a GSM (global system for mobile telecommunications) system, transmits and receives information over each assigned slot or channel. Each channel of a frame is assigned to a different user with transmission (uplink) information on one frequency band and reception (downlink) information on a separate frequency band communicated over each channel.

Each channel is specified to ramp-up to a required power level for burst transmissions and ramp-down to a required power level in a predetermined amount of time, called a burst. Thus a burst has a ramp-up phase or cycle, an operational phase or cycle, and a ramp-down phase or cycle. GSM specifications also require that the power at the start and end of a burst must be at a specified minimum level and that the transition from the minimum power level to the final required power level must be completed in a specified time window. The time frame for ramping up and down is specified in order to reduce the generation of transient side bands and interference on adjacent channels.

The operation of a typical power control loop is divided into an open loop mode and a closed loop mode. The power control loop runs in open loop mode until the output of the power amplifier has reached a predetermined level, referred to as the switching point. At the switching point an error signal is produced using the difference of a supplied reference signal and the output of a detector which samples the signal at the output of the control loop. An integrator is used to produce a control voltage from the error signal, which is used to control a variable attenuator as a means to control power levels when ramping and during transmission bursts.

FIG. 1(a) depicts a graph of the power output of a power amplifier controlled by a conventional power control loop. During ramp-up, section A, the power output rises to the appropriate level. During transmission or operation, section B, the power output is held substantially steady by the power control loop. During ramp-down, section C, the power output falls.

A disadvantage of conventional power control loops is illustrated in FIG. 1(b). FIG. 1(b) depicts a graph of the power output of a power amplifier transmitting a non-constant envelope modulated burst, such as an AM burst. As in FIG. 1(a), during key up, section A, the power output rises to the appropriate level. However, during transmission, section B, the power output fluctuates according to the amplitude of the signal being transmitted. During key down, section C, the power output falls. A conventional power controller would tend to level out the variations in power due to the AM burst. Such a situation is unacceptable for advanced wireless transmissions using AM. A known solution allowing a conventional power control loop to be used with amplitude modulation transmissions is to add a sample and hold circuit to the power control loop. Power levels are sampled during ramping and the level is held steady during an AM burst. However, FIG. 1(b) illustrates a disadvantage of this approach when applied to advanced modulation schemes, known as gain tilt. Gain tilt can occur during a transmission burst. FIG. 1(b) depicts the gain tilt effect, showing the expected gain level at the end of the burst and the actual gain level due to gain tilt at the end of a burst. The sample and hold circuitry of a conventional power controller works on an assumption that gain does not change during a burst and does not attempt to control gain tilt during the burst.

Because of the problems that arise in the power control loop due to non-constant envelop modulation, in prior art techniques it has generally been possible only to operate in open-loop mode during the operational cycle, or to use only a very low control loop-bandwidth during the operational cycle. The latter solution leads to two particular problem. Firstly, the power control loop is unable to correct for gain variations over the burst, Secondly, because of the slow averaging, certain data patterns can cause transients at the end of the burst when restoring loop-bandwidth just prior to ramp-down.

International patent application publication number WO 01/03292 discloses one known technique directed at improving power control in systems utilising non-constant envelope modulation. The power control operation is based on the use of a sample and hold circuit. During ramp-up, a power level detected at the output of the amplifier is compared to a reference signal to give an error signal used for attenuation of the output signal. During the burst phase, the power level detected at the output of the amplifier is compared to the modulated RF signal to be transmitted to give the error signal used for attenuation of the output signal. Thus, in effect, during the burst the control loop operates in an open-loop mode, with respect to the reference signal, using a scaled envelope signal to generate the loop error signal.

One potential problem with the technique disclosed in WO 01/03292 is that there may be a small offset associated with the sample-and-hold circuit. Thus, there may be a small difference in the control signal applied for the attenuation of the output signal during switching. This may be translated into a glitch in the output signal when switching between the ramp-up period and the operational period.

It is an aim of the present invention to provide an improved power control loop which is suitable for use in non-constant envelope modulation environment but which retains all the advantages of a standard power control loop.

SUMMARY OF THE INVENTION

The present invention provides a technique for control of transmitter power which preserves modulation characteristics, and which is thus particularly advantageous when utilised in systems with non-constant modulation schemes. This improvement is achieved by combining the power level control signal with the modulation envelope of the modulated RF carrier signal during a transmission burst. Further improvement may be obtained by reducing the bandwidth of the control system during the burst.

Thus, in accordance with a first aspect of the present invention, there is provides a method of control in a power control loop, comprising the steps of: amplifying a non-constant envelope modulation signal to thereby produce an output signal; combining a power level control signal with a signal representing the envelop of modulation; comparing the combined signal to a signal representing the power level of the output signal to thereby produce a comparison signal; and attenuating the amplified signal in dependence on said comparison signal.

The power control loop may have at least a ramp-up cycle and an operational cycle. During the operational cycle the bandwidth of the power control loop may be reduced. The method may be implemented during all cycles of the power control loop. The power control loop may further include a ramp-down cycle.

In a preferred embodiment, the technique of the invention is applied during all phases of operation, and not just during the burst. Thus the technique is used during the ramp-up phase. As such the present invention does not suffer from the drawbacks of the prior art technique of WO 01/03292, as discussed hereinabove.

In a further aspect the present invention provides a method of control in a power control loop, comprising the steps of: ramping up an output signal during a first cycle; and maintaining a substantially constant output signal during a second cycle, wherein in said first and second cycles the method further comprises: amplifying a non-constant envelope modulation signal to thereby produce the output signal; combining a power level control signal with a signal representing the envelop of modulation; comparing the combined signal to a signal representing the power level of the output signal to thereby produce a comparison signal; and attenuating the amplified signal in dependence on said comparison signal.

The present invention still further provides in another aspect a power control loop, comprising: an amplifier for amplifying a non-constant envelop modulation signal to thereby produce an output signal; a combiner for combining a power level control signal with a signal representing the envelop of modulation; a comparator for comparing the combined signal to a signal representing the power level of the output signal to thereby produce a comparison signal; and an attenuator for attenuating the signal to be amplified in dependence on said comparison signal.

DESCRIPTION OF PREFERRED EMBODIMENT

Figure 1A:
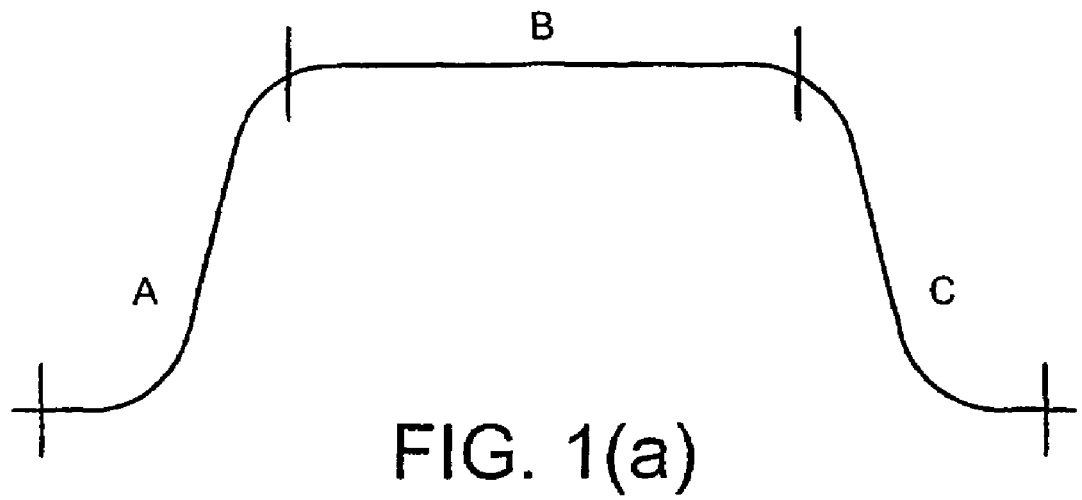
FIG. 1(a) illustrates a graph of the power output of a power amplifier controlled by a conventional power control loop.
Figure 1B:
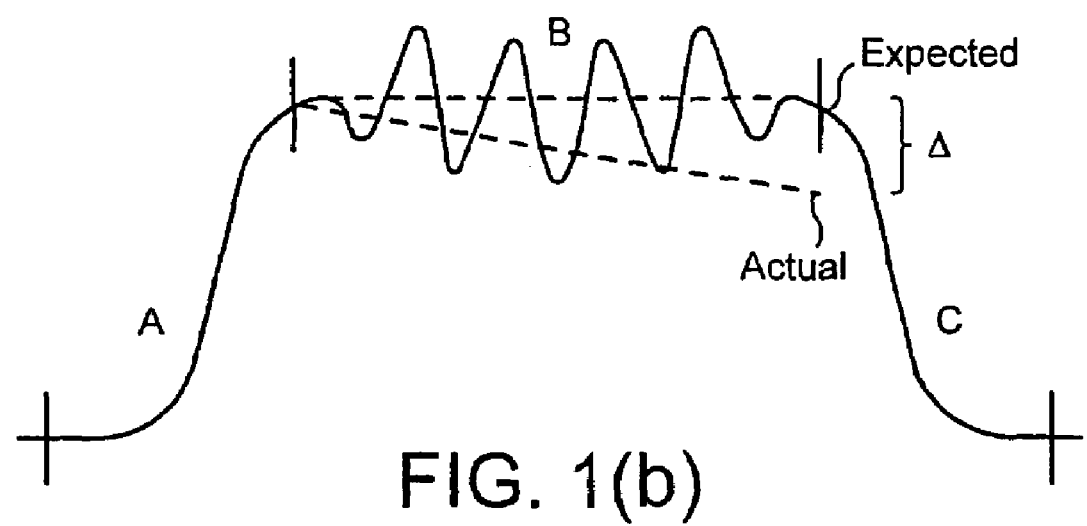
FIG. 1(b) illustrates a graph of the power output of a power amplifier transmitting a non-constant envelope modulated signal.
Figure 2:
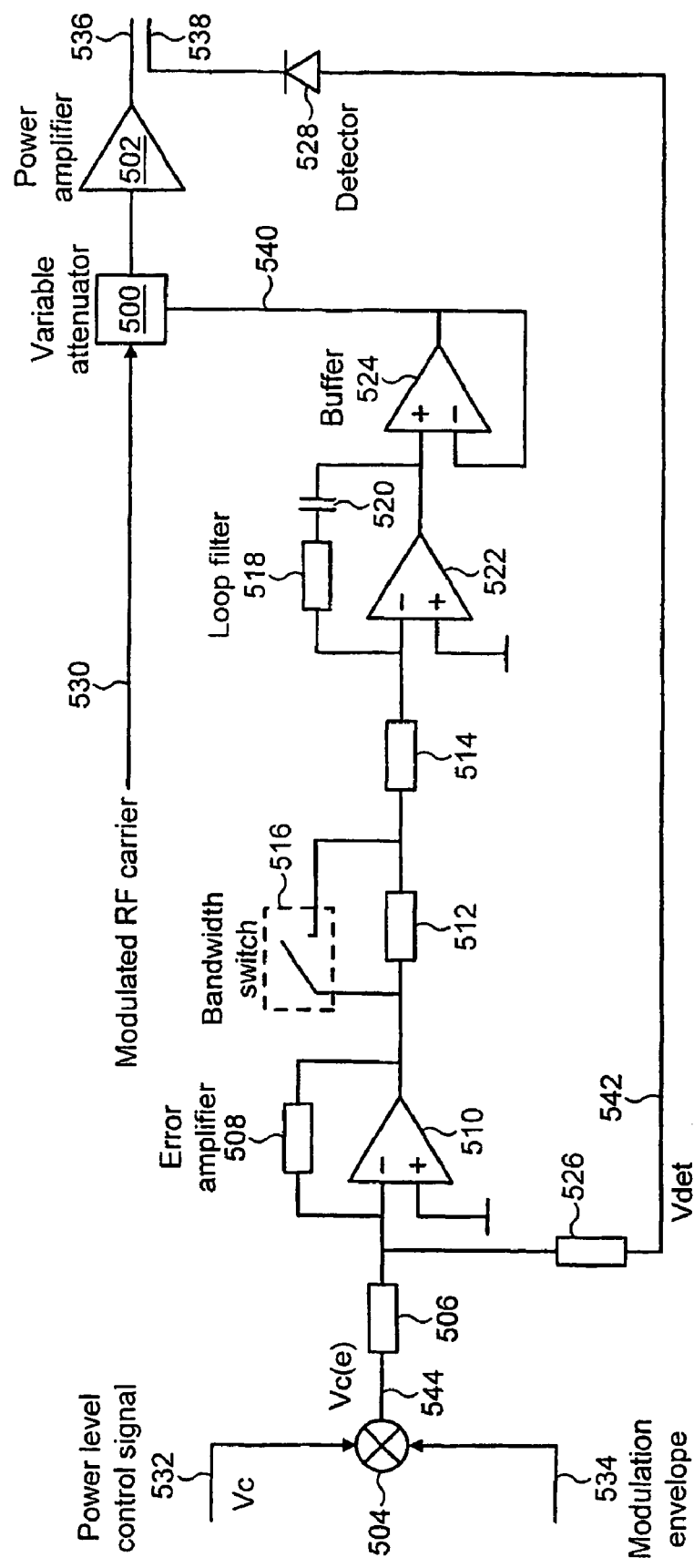
FIG. 2 illustrates a block diagram of a power control loop in accordance with a preferred embodiment of the present invention.

A preferred embodiment of power control system in accordance with the present invention is shown in FIG. 2. The power control system includes a variable attenuator 500, a power amplifier 502, a detector/lineariser comprising a diode 528, a comparator formed by resistors 506 and 526, a mixer 504, an error amplifier comprising operational amplifier 510 and resistor 508, a bandwidth switch comprising resistor 512 and switch 516, a loop filter comprising operational amplifier 522, resistor 518 and capacitor 520, and a buffer 524.

The variable attenuator 500 receives as a first input on line 530 a modulated RF carrier signal to be transmitted. As will be described in further detail hereinbelow the variable attenuator receives as a second input an attenuator control signal on line 540. The modulated RF carrier signal, after attenuation in the variable attenuator 500, is applied to the power amplifier 502. An amplified output signal is then generated on line 536.

The input to the detector/lineariser on line 538 detects a sample of the output signal on line 536, and generates a detected voltage signal Vdet on line 542.

The mixer 504 receives as a first input a power level control signal Vc on line 532, and as a second input the envelope signal of the modulated RF carrier on line 534. The signal Vc is generated within a digital ASIC which provides all the control signals for the transmitter. The modulation envelope, provided on line 534, is also generated within such a digital ASIC. The ASIC preferably includes the modulator, and hence it is easy to generate an envelope signal of the modulation directly.

The signals on lines 532 and 534—Vc and the modulation envelope—are preferably both digital words. The signal Vc(e) on line 544 may be generated by passing the output from the mixer into a digital-to-analogue converter to produce an analogue voltage. Such an implementation is preferred because it is relatively easy to implement the mixing process digitally. In principle, it is possible to implement the generation of Vc(e) using a mixing process if Vc and the modulation envelope are both analogue quantities. In such a case, the modulation envelope could be generated by detecting the amplitude of the modulated carrier at IF or RF. However, clearly producing Vc(e) by processing digital quantities is more efficient than using analogue quantities.

The mixer 504 multiplies the power level control signal Vc with the envelope signal and thereby generates a composite level control signal Vc(e) on line 544. The envelope of the composite level control signal Vc(e) tracks the envelope of the modulated RF carrier.

The composite level control signal Vc(e) on line 544 is compared to the detected voltage level Vdet on line 542 at the input to the error amplifier. The error amplifier output is amplified and applied to control input of the variable gain RF attenuator 500, via the bandwidth switch, loop filter and buffer. The error amplifier output thus adjusts the transmitter output level on line 536.

The power level control signal Vc is ramped at the start and end of each timeslot, and sets the average RF power level during the burst. The value of Vc, at the input to the mixer 532, sets the average RF level. Due to the use of the modulation envelope signal at the input to the mixer 504, the average power is controlled without distorting the modulation envelope.

Due to the operation of the mixer 504 the instantaneous value of the power level control signal tracks the envelope of the modulated RF signal, and closed-loop power control is therefore possible without distortion of the RF modulation envelope. The technique of the present invention is therefore particularly advantageous in systems utilising non-constant modulation techniques, such as EDGE systems.

For correct operation, there should be a negligible timing difference between the envelope of the composite level control signal Vc(e) and the modulation envelope of the RF carrier. However, in practical systems a timing error may cause the control-loop to distort the RF carrier envelope. In order to ensure such distortion does not arise, in the preferred embodiment of the present invention the bandwidth switch is 'opened' during the active part of the burst, thereby reducing the control loop bandwidth. At lower bandwidths, the effect of the timing differences on the control loop is reduced.

Thus, in the preferred embodiment, the control-loop bandwidth is reduced during the useful part of the burst which limits the sensitivity of the control-loop to timing differences present in practical systems. In the preferred embodiment of the invention illustrated in FIG. 2, the bandwidth switch reduces the sensitivity of the control loop to timing differences. Thus, in effect, the use of the bandwidth switch improves the effectiveness of the control loop where timing differences exist.

The minimum control loop bandwidth required to track the ramp-up and ramp-down of the power level control signal (at the start and end of the burst) is approximately 50 kHz. Typically, systems are designed with a maximum bandwidth of 200 kHz to 300 kHz, because of variations in loop bandwidth over the operating range of the variable attenuators. The recommended loop bandwidth during the burst is approximately 10 kHz, thus a bandwidth reduction ratio of 20 is implemented.

The invention claimed is:

1. A method of control in a power control loop, the method comprising:
   amplifying a non-constant envelope modulation signal to thereby produce an output signal;
   combining a power level control signal with a signal representing the envelop of modulation;
   comparing the combined signal to a signal representing the power level of the output signal to thereby produce a comparison signal; and
   attenuating the amplified signal in dependence on said comparison signal,
   wherein the power control loop has at least a ramp-up cycle and an operational cycle, and
   wherein during the operational cycle the bandwidth of the power control loop is reduced.

2. A method according to claim 1, wherein said method is implemented during all cycles of the power control loop.

3. A method according to claim 1, wherein the power control loop further includes a ramp-down cycle.

4. A method of control in a power control loop, the method comprising:
   ramping up an output signal during a first cycle; and
   maintaining a substantially constant output signal during a second cycle,
   wherein in said first and second cycles the method further comprises
      amplifying a non-constant envelope modulation signal to thereby produce the output signal;
      combining a power level control signal with a signal representing the envelop of modulation;
      comparing the combined signal to a signal representing the power level of the output signal to thereby produce a comparison signal; and
      attenuating the amplified signal in dependence on said comparison signal,
   wherein during an operational cycle the bandwidth of the power control loop is reduced.

5. A power control loop, comprising:
   an amplifier configured to amplify a non-constant envelop modulation signal to thereby produce an output signal;
   a combiner configured to combine a power level control signal with a signal representing the envelop of modulation;
   a comparator configured to compare the combined signal to a signal representing the power level of the output signal to thereby produce a comparison signal; and
   an attenuator configured to attenuate the signal to be amplified in dependence on said comparison signal,
   a device configured to vary the bandwidth of the power control loop, wherein the device is controlled to lower the bandwidth in the operational cycle, and
   wherein, in use, said power control loop is controlled in at least a ramp-up cycle of operation and an operational cycle of operation.

6. A power control loop according to claim 5, wherein the device configured to vary the bandwidth varies the bandwidth of the comparison signal.

7. A wireless communications system including a power control loop according to claim 5.

8. A power control loop, comprising:
   amplifying means for amplifying a non-constant envelope modulation signal to thereby produce an output signal;
   combining means for combining a power level control signal with a signal representing the envelop of modulation;
   comparing means for comparing the combined signal to a signal representing the power level of the output signal to thereby produce a comparison signal; and
   attenuating means for attenuating the amplified signal in dependence on said comparison signal,
   wherein the power control loop has at least a ramp-up cycle and an operational cycle, and
   wherein during the operational cycle the bandwidth of the power control loop is reduced.

* * * * *